United States Patent
Park et al.

(10) Patent No.: US 11,233,094 B2
(45) Date of Patent: Jan. 25, 2022

(54) DISPLAY APPARATUS

(71) Applicant: Samsung Display Co., Ltd., Yongin-si (KR)

(72) Inventors: Hongsik Park, Yongin-si (KR);
Hyungjun An, Yongin-si (KR);
Hwanwoo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 224 days.

(21) Appl. No.: 16/707,800

(22) Filed: Dec. 9, 2019

(65) Prior Publication Data

US 2020/0119105 A1    Apr. 16, 2020

Related U.S. Application Data

(63) Continuation of application No. 15/471,338, filed on Mar. 28, 2017, now Pat. No. 10,504,968.

(30) Foreign Application Priority Data

Mar. 28, 2016 (KR) .......................... 10-2016-0036956

(51) Int. Cl.
*H01L 27/32* (2006.01)
*H01L 27/15* (2006.01)

(52) U.S. Cl.
CPC ........ *H01L 27/3213* (2013.01); *H01L 27/156* (2013.01); *H01L 27/3216* (2013.01); *H01L 27/3218* (2013.01); *H01L 27/3244* (2013.01); *H01L 27/322* (2013.01)

(58) Field of Classification Search
None
See application file for complete search history.

(56) References Cited

U.S. PATENT DOCUMENTS

| | | | |
|---|---|---|---|
| 7,889,213 | B2 | 2/2011 | Baek et al. |
| 8,330,152 | B2 | 12/2012 | So |
| 2009/0322215 | A1* | 12/2009 | Sung .................... H01L 27/3211 313/504 |

(Continued)

FOREIGN PATENT DOCUMENTS

| KR | 10-2003-0042603 | 6/2003 |
|---|---|---|
| KR | 10-2005-0059396 | 6/2005 |

(Continued)

*Primary Examiner* — Bilkis Jahan
(74) *Attorney, Agent, or Firm* — Kile Park Reed & Houtteman PLLC

(57) ABSTRACT

A display apparatus includes a substrate including a display region and a non-display region, a blue sub-pixel in the display region of the substrate, an imaginary line extending across the blue sub-pixel, a first sub-unit on a first side of the imaginary line, the first sub-unit including a red sub-pixel, a green sub-pixel, and a white sub-pixel, and a second sub-unit on a second side of the imaginary line, the second sub-unit including a red sub-pixel, a green sub-pixel, and a white sub-pixel, wherein the first sub-unit and the blue sub-pixel constitute a first pixel, and the second sub-unit and the blue sub-pixel constitute a second pixel, and wherein the blue sub-pixel emits light according to a data signal generated based on blue-related data of first pixel data corresponding to the first pixel and blue-related data of second pixel data corresponding to the second pixel.

14 Claims, 10 Drawing Sheets

(56) References Cited

U.S. PATENT DOCUMENTS

| | | | |
|---|---|---|---|
| 2010/0097387 A1 | 4/2010 | Kim et al. | |
| 2013/0285537 A1 | 10/2013 | Chaji | |
| 2014/0001447 A1* | 1/2014 | Kim | H01L 51/52 |
| | | | 257/40 |
| 2015/0214280 A1 | 7/2015 | Furuie | |
| 2016/0240593 A1* | 8/2016 | Gu | H01L 27/3262 |
| 2016/0315127 A1 | 10/2016 | Yoon et al. | |
| 2018/0286929 A1* | 10/2018 | Li | H01L 27/3213 |

FOREIGN PATENT DOCUMENTS

| | | |
|---|---|---|
| KR | 10-2010-0043751 | 4/2010 |
| KR | 10-2012-0087187 | 8/2012 |
| KR | 10-2015-0106622 | 9/2015 |

\* cited by examiner

DISPLAY APPARATUS

CROSS-REFERENCE TO RELATED APPLICATION(S)

This is a continuation application based on pending U.S. patent application Ser. No. 15/471,338, filed on Mar. 28, 2017, the disclosure of which is incorporated herein by reference in its entirety. U.S. patent application Ser. No. 15/471,338 claims priority benefit of Korean Patent Application No. 10-2016-0036956, filed on Mar. 28, 2016, in the Korean Intellectual Property Office and entitled: "Display Apparatus," the disclosure of which is incorporated by reference herein in its entirety for all purposes.

BACKGROUND

1. Field

One or more embodiments relate to a display apparatus.

2. Description of the Related Art

Recently, demand for display devices has increased due to improvements in the performance of display devices, e.g., increased screen size and reduced weight, based on the rapid developments in semiconductor technologies. Examples of such display devices include a liquid crystal display (LCD), a plasma display device (PDP), a field-emission display (FED), an electroluminescence display (ELD), an electrophoresis display (EPD), an organic light-emitting diode (OLED) display, etc.

In a display device, a plurality of unit pixels are configured by using a red pixel, a green pixel, and a blue pixel, thereby displaying various color images. A red pixel, a green pixel, and a blue pixel may be arranged in various shapes and are generally arranged in a stripe-like shape or a matrix-like shape.

SUMMARY

According to one or more embodiments, a display apparatus includes a substrate including a display region and a non-display region; a blue sub-pixel disposed in the display region of the substrate; a first sub-unit, which is located on a first side of an imaginary line extending across the blue sub-pixel and includes a red sub-pixel, a green sub-pixel, and a white sub-pixel; and a second sub-unit, which is located on a second side of the imaginary line and includes a red sub-pixel, a green sub-pixel, and a white sub-pixel, wherein the first sub-pixel and the blue sub-pixel constitute a first pixel and the second sub-unit and the blue sub-pixel constitute a second pixel, and the blue sub-pixel emits light according to a data signal generated based on blue-related data of first pixel data corresponding to the first pixel and blue-related data of second pixel data corresponding to the second pixel.

According to an embodiment, the red sub-pixel, the green sub-pixel, and the white sub-pixel of the first sub-unit may be located at locations different from locations of the red sub-pixel, the green sub-pixel, and the white sub-pixel of the second sub-unit, respectively.

According to an embodiment, the red sub-pixel, the green sub-pixel, and the white sub-pixel of the first sub-unit and the red sub-pixel, the green sub-pixel, and the white sub-pixel of the second sub-unit may be arranged in a circumferential direction around the blue sub-pixel.

According to an embodiment, the display apparatus may further include a third sub-unit, which is disposed on the first side of the imaginary line and includes the red sub-pixel, the green sub-pixel, and the white sub-pixel; and a fourth sub-unit, which is disposed on the second side of the imaginary line and includes the red sub-pixel, the green sub-pixel, and the white sub-pixel, wherein the third sub-unit and the blue sub-pixel may constitute a third pixel and the fourth sub-unit and the blue sub-pixel may constitute a fourth pixel, and the blue sub-pixel may emit light according to a data signal generated based on blue-related data of first pixel data corresponding to the first pixel, blue-related data of second pixel data corresponding to the second pixel, blue-related data of third pixel data corresponding to the third pixel, and blue-related data of fourth pixel data corresponding to the fourth pixel.

According to an embodiment, the third sub-unit may be located at a location different from that of the first sub-unit, and the fourth sub-unit may be located at a location different from that of the second sub-unit.

According to an embodiment, the first sub-unit, the second sub-unit, the third sub-unit, and the fourth sub-unit may be arranged in a circumferential direction around the blue sub-pixel so as to surround the blue sub-pixel.

According to an embodiment, the red sub-pixel, the green sub-pixel, and the white sub-pixel of the first sub-unit and the red sub-pixel, the green sub-pixel, and the white sub-pixel of the second sub-unit may be arranged along a line intersecting the imaginary line.

According to an embodiment, the display apparatus may be an organic light-emitting display apparatus.

According to an embodiment, size of the blue sub-pixel may be greater than that of the red sub-pixel, the green sub-pixel, or the white sub-pixel of the first sub-unit or the second sub-unit.

According to an embodiment, independent data may be applied to each of the red sub-pixels, the green sub-pixels, and the white sub-pixels of the first sub-unit and the second sub-unit.

The data signal regarding the blue sub-pixel may be a signal generated by averaging the blue-related data of first pixel data corresponding to the first pixel and the blue-related data of second pixel data corresponding to the second pixel.

According to an embodiment, the first pixel and the second pixel may constitute a single unit structure, a plurality of such unit structures may be provided, and the plurality of unit structures may be arranged in a matrix-like shape.

According to an embodiment, the first pixel and the second pixel may constitute a single unit structure, a plurality of such unit structures may be provided, and the plurality of unit structures may be arranged in a zigzag shape.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
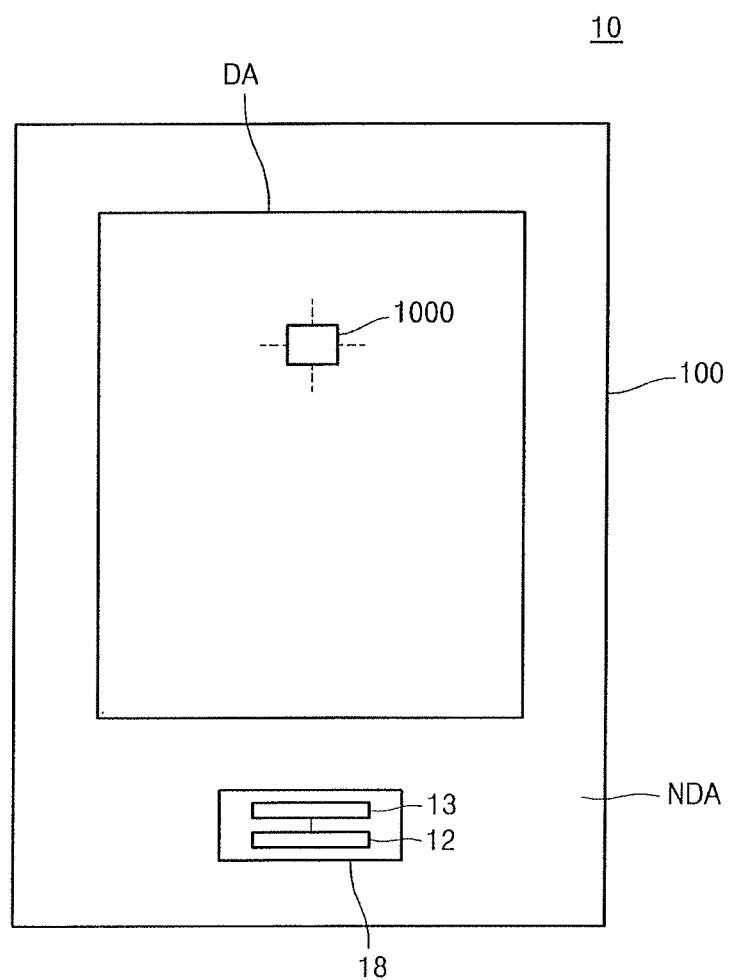
FIG. 1 illustrates a schematic plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

In embodiments below, when a film, an area, or an element is referred to as being connected, not only the case where the film, the region, or the element is directly connected, but also the film, the region, and the element is indirectly connected via another film, another region, and another element. For example, in the present specification, when a film, an area, or a element is electrically connected, not only the case where the film, the region, or the element is directly electrically connected, but also the film, the region, and the element is indirectly electrically connected via another film, another region, and another element.

Figure 2:
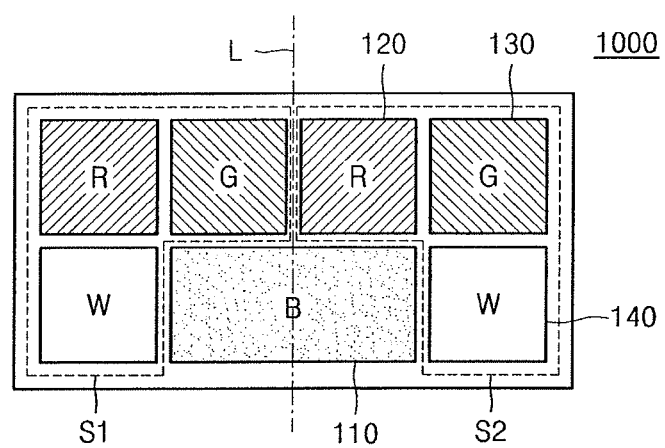
FIG. 2 illustrates a magnified plan view of a unit structure shown in FIG. 1.

FIG. 1 is a schematic plan view of a display apparatus 10 according to an embodiment, and FIG. 2 is a magnified plan view of a unit structure 1000 shown in FIG. 1.

Referring to FIG. 1, the display apparatus 10 according to an embodiment may include a substrate 100 and a plurality of pixels. The plurality of pixels may constitute, e.g., be arranged in, unit structures 1000.

The substrate 100 includes a display area DA for displaying an image and a non-display area NDA adjacent to the display area DA. The display area DA includes a plurality of unit structures 1000, and sub-pixels for emitting certain light are disposed in each of the unit structures 1000. An image is provided by light emitted by the plurality of pixels disposed in the display area DA.

The non-display area NDA may surround the display area DA and may include a driver 18, e.g., a scan driver and/or a data driver, for transmitting a certain signal to the plurality of pixels disposed in the display area DA. For example, the driver 18 may include a data input unit, a data converter 12, and a blue signal generator 13.

Although FIG. 1 shows a case where the non-display area NDA surrounds the display area DA, e.g., along four sides, embodiments are not limited thereto. According to another embodiment, the non-display area NDA may be disposed, e.g., only, on one side of the display area DA to reduce an area where the image is not displayed, i.e., to reduce a dead area.

Referring to FIG. 2, according to an embodiment, the display apparatus 10 may include a blue sub-pixel 110, a first sub-unit S1, and a second sub-unit S2 in one unit structure 1000. The blue sub-pixel 110 may be disposed in the display area DA of the substrate 100. The blue sub-pixel 110 may be disposed between the first sub-unit S1 and the second sub-unit S2 that will be described below.

As illustrated in FIG. 2, the first sub-unit S1 is located on a first side, e.g., left side of FIG. 2, of an imaginary line L extending across the blue sub-pixel 110. The first sub-unit S1 may include a red sub-pixel 120, a green sub-pixel 130, and a white sub-pixel 140. For example, as illustrated in FIG. 2, the red sub-pixel 120, green sub-pixel 130, and white sub-pixel 140 may be arranged in a L-shaped pattern to have the red sub-pixel 120 adjacent to one side of the blue sub-pixel 110, the white sub-pixel 140 adjacent to another side of the blue sub-pixel 110, and the green sub-pixel 130 between the red and white sub-pixels 120 and 140 adjacent to a corner of the blue sub-pixel 110.

The second sub-unit S2 is located on a second side, e.g., right side of FIG. 2, of the imaginary line L extending across the blue sub-pixel 110 and, like the first sub-unit S1, may include a red sub-pixel 120, a green sub-pixel 130, and a white sub-pixel 140. The second sub-unit S2 may be disposed symmetrically with respect to the first sub-unit S1 around the imaginary line L.

An order of arranging the red sub-pixel 120, the green sub-pixel 130, and the white sub-pixel 140 included in the second sub-unit S2 may not necessarily be symmetrical with respect to an order of arranging the red sub-pixel 120, the green sub-pixel 130, and the white sub-pixel 140 included in the first sub-unit S1. As shown in FIG. 2, in the first sub-unit S1, the white sub-pixel 140, the red sub-pixel 120, and the green sub-pixel 140 may be arranged in the stated order along a circumferential direction around the blue sub-pixel 110. As shown in FIG. 2, in the second sub-unit S2, the red sub-pixel 120, the green sub-pixel 130, and the white sub-pixel 130 may be arranged in the stated order along a circumferential direction around the blue sub-pixel 110. According to another embodiment, sub-pixels of the first sub-unit S1 and the second sub-unit S2 may also be arranged symmetrically around the imaginary line L with respect to colors emitted therefrom.

The one blue sub-pixel 110, the first sub-unit S1, and the second sub-unit S2 may constitute one unit structure 1000. The red sub-pixel 120, the green sub-pixel 130, and the white sub-pixel 140 of the second sub-unit S2 may be disposed at locations different from, e.g., not adjacent to, those of the red sub-pixel 120, the green sub-pixel 130, and the white sub-pixel 140 of the first sub-unit S1, respectively. Therefore, each of the first sub-unit S1 and the second sub-unit S2 includes one red sub-pixel 120, one green sub-pixel 130, and one white sub-pixel 140, so each unit structure 1000 includes two red sub-pixels 120, two green sub-pixels 130, and two white sub-pixels 140. Accordingly, a ratio of the numbers of the blue sub-pixel 110, the red sub-pixels 120, the green sub-pixels 130, and the white sub-pixels 140 in each unit structure 1000 is 1:2:2:2.

Figure 3A:
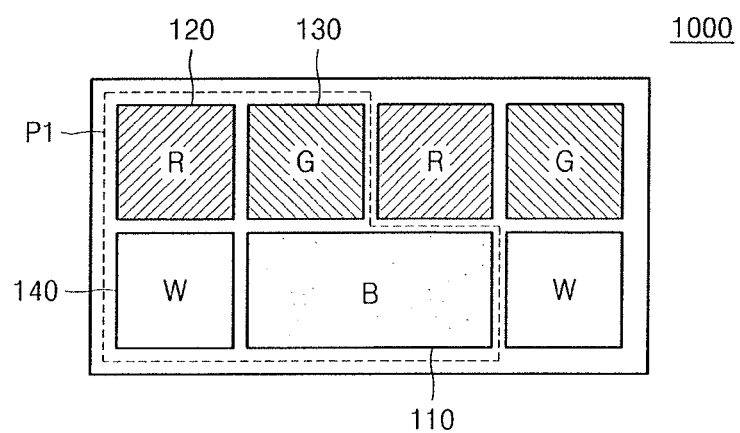
FIGS. 3A and 3B illustrate schematic diagrams showing a method of driving the unit structure shown in FIG. 2 pixel-by-pixel according to an embodiment.
Figure 3B:
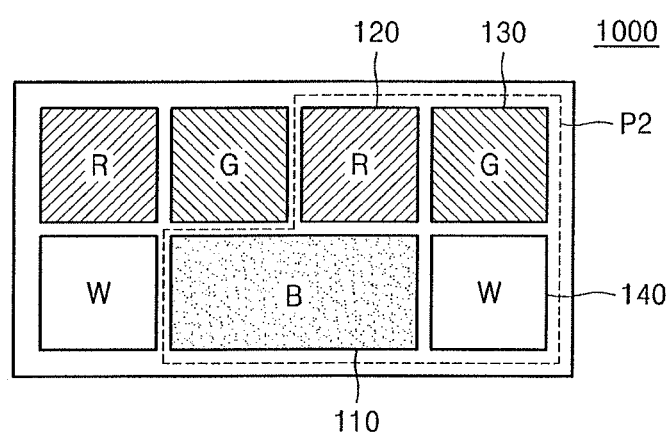
Figure 4:
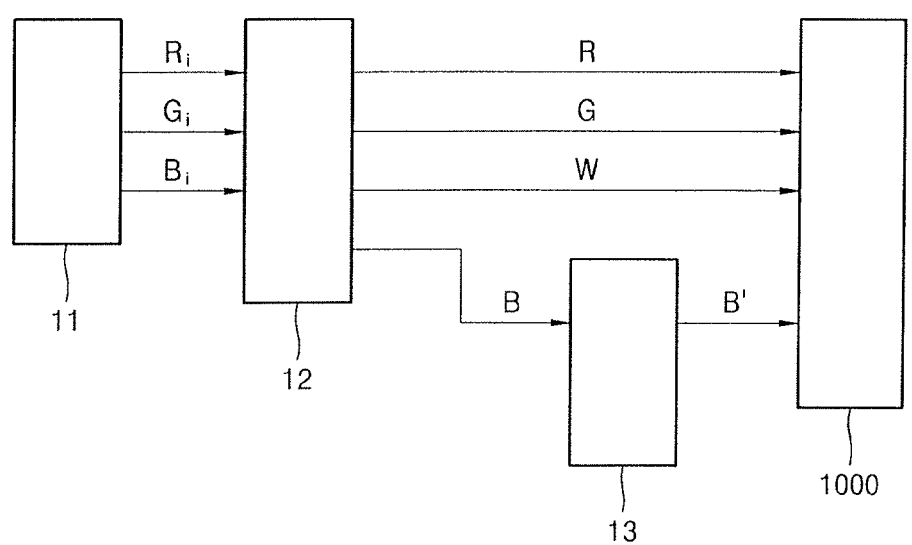
FIG. 4 illustrates a schematic block diagram of a driver of the display apparatus shown in FIG. 1 according to an embodiment.

FIGS. 3A and 3B are schematic diagrams for explaining a method of driving the unit structure 1000 shown in FIG. 2 pixel-by-pixel according to an embodiment. FIG. 4 is a schematic block diagram of the driver 18 of the display apparatus 10.

Referring to FIGS. 3A and 3B, according to an embodiment, the unit structure 1000 may include a first pixel P1 and a second pixel P2. The first sub-unit S1 and the blue sub-pixel 110 constitute the first pixel P1 (FIG. 3A), whereas the second sub-unit S2 and the blue sub-pixel 110 constitute the second pixel P2 (FIG. 3B). In other words, the first pixel P1 and the second pixel P2 may share the blue sub-pixel 110.

The blue sub-pixel 110 may be larger than each of the individual sub-pixels in either of the first and second sub-units S1 and S2. According to an embodiment, when the sizes of the red sub-pixel 120, green sub-pixel 130, and white sub-pixel 140 are the same, the blue sub-pixel 110 may be at least twice as large as either of the sub-pixels 120 through 140. As described above, the number of blue sub-pixels 110 included in one unit structure 1000 may be smaller than the number of sub-pixels of each of the other colors. However, as the display apparatus 10 includes only one blue sub-pixel 110 in each of the unit structures 1000, the display apparatus 10 may utilize the light-screening areas arranged between the sub-pixels to define the respective sub-pixels as emission areas. In other words, due to the single, shared blue sub-pixel, e.g., an emission area of the blue sub-pixel may be increased as compared to multiple blue sub-pixels separated from each other, the display apparatus 10 may have an increased aperture ratio, i.e., a ratio between the light emission area and the whole pixel area.

Referring to FIG. 4, the driver 18 may include a data input unit 11, the data converter 12, and the blue signal generator 13. The data input unit 11 may generate initial data Ri related to red, initial data Gi related to green, and initial data Bi related to blue corresponding to each pixel from screen information corresponding to each pixel.

The data converter 12 may convert pixel information Ri, Gi, and Bi generated by the data input unit 11 into quad type data R, G, B, and W. At this time, the red-related data R, the green-related data G, and the white-related data W may be independently provided to each pixel. In other words, the red-related data R, the green-related data G, and the white-related data W that are applied to the first sub-unit S1 of the first pixel P1 are independent from the red-related data R, the green-related data G, and the white-related data W that are applied to the second sub-unit S2 of the second pixel P2.

Meanwhile, the blue sub-pixel 110 may emit light according to data signals generated based on blue-related data of the first pixel data corresponding to the first pixel P1 and blue-related data of the second pixel data corresponding to the second pixel P2. Specifically, a data signal of the blue sub-pixel 110 may be a signal obtained by averaging blue-related data corresponding to neighboring pixels. The blue signal generator 13 averages blue-related data B corresponding to the first pixel P1 and the second pixel P2 and generates a data signal B' of the blue sub-pixel 110. Since blue is less visible than the other colors, even when the display apparatus 10 averages blue-related data corresponding to respective pixels, image quality problems, e.g., uneven colors due to color mixture, may be minimized.

In the present specification, the data converter 12 and the blue signal generator 13 are separately described for convenience of explanation. However, embodiments are not limited thereto. The display apparatus 10 may include a data processor and functions of the data converter 12 and the blue signal generator 13 may be performed in one data processing unit at once to generate data signals applied to respective sub-pixels.

As described above, the display apparatus 10 may combine the blue sub-pixel 110 of the first pixel P1 with the blue sub-pixel 110 of the second pixel P2, average blue-related data applied to the respective pixels, and apply the averaged blue-related data to the blue sub-pixel 110 as a single data signal. Therefore, the display apparatus 10 may reduce the number of data lines connected to the pixels P1 and P2 to apply blue-related data, and thus the aperture ratio may be increased.

Figure 5A:
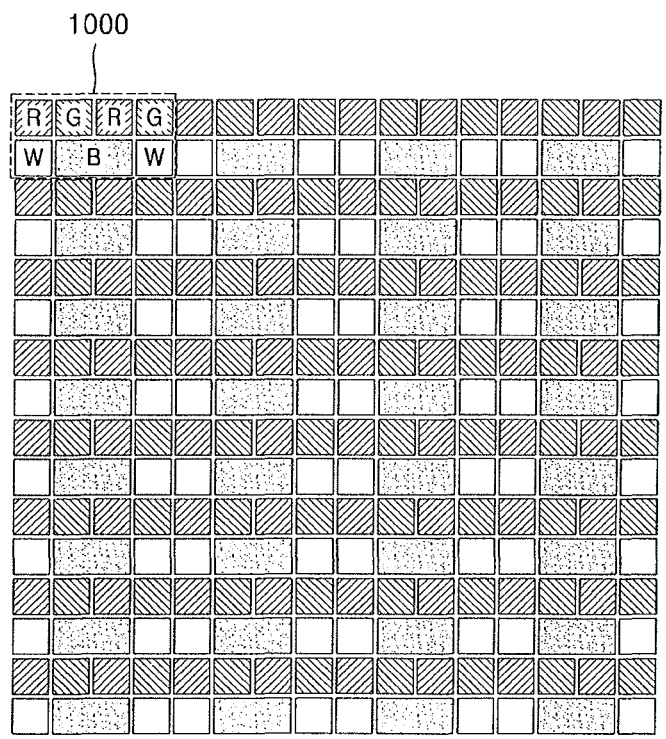
FIGS. 5(a) and 5(b) illustrate diagrams of example arrangements of the unit structures shown in FIG. 2 according to an embodiment.
Figure 5B:
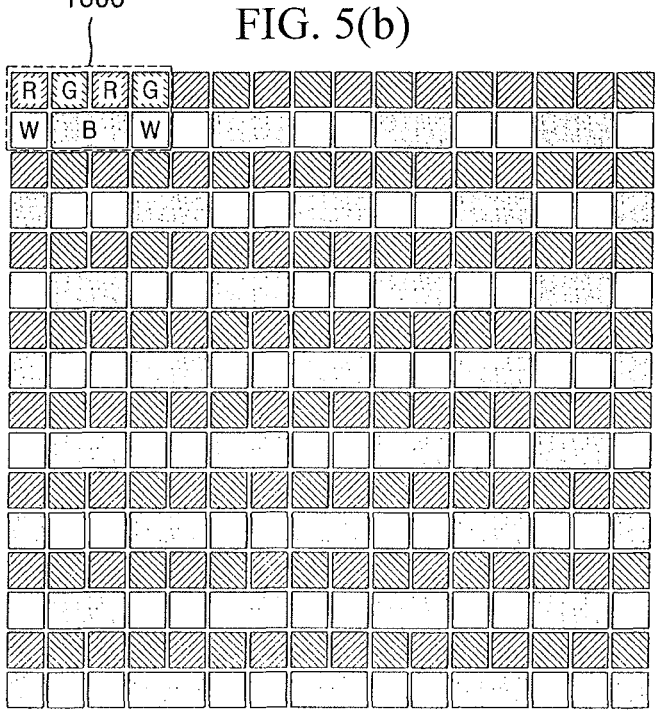

FIGS. 5(a) and 5(b) are diagrams showing example arrangements of the unit structures 1000 shown in FIG. 2.

For example, as illustrated in FIG. 5(a), the plurality of unit structures 1000 may be arranged in a matrix-like shape. That is, the plurality of unit structures 1000 may be arranged on the display area DA with the blue sub-pixels 110 being positioned to define a matrix pattern in the display area DA (gray rectangles in FIG. 5(a)).

In another example, as illustrated in FIG. 5(b), the plurality of unit structures 1000 may be arranged in a column direction in a zigzag shape. That is, the plurality of unit structures 1000 may be arranged on the display area DA with the blue sub-pixels 110 being arranged in a zigzag pattern (gray rectangles in FIG. 5(b)). In other words, in FIG. 5B, the plurality of unit structures 1000 are arranged in a zigzag shape in which the blue sub-pixels 110 do not overlap each other. However, embodiments are not limited thereto, e.g., the unit structures 1000 may be arranged in any of various types of arrangement structures.

Hereinafter, various embodiments of a pixel group will be described. However, redundant descriptions of components will be omitted for simplicity of explanation.

Figure 6:
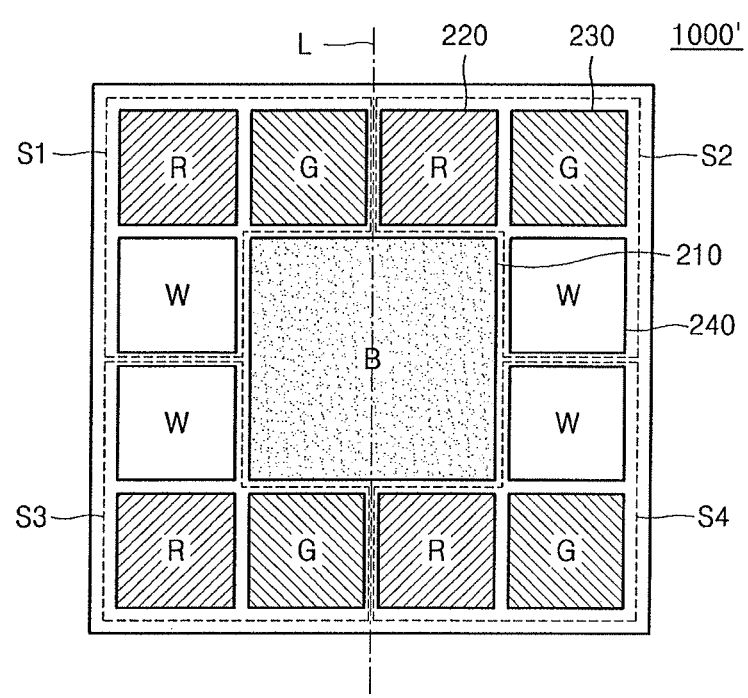
FIG. 6 illustrates a magnified plan view of another embodiment of the display apparatus shown in FIG. 1.
Figure 7A:
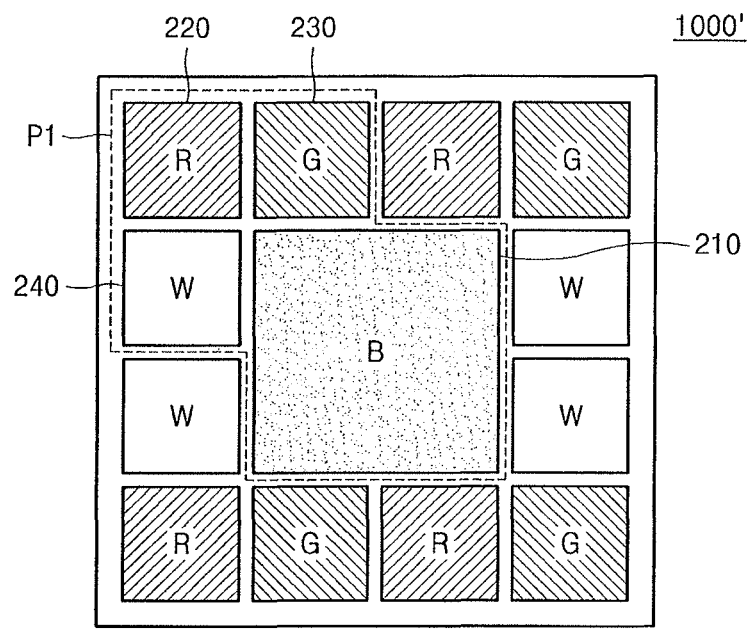
FIGS. 7A and 7B illustrate diagrams schematically showing a method of driving the unit structure shown in FIG. 6 pixel-by-pixel according to an embodiment.
Figure 7B:
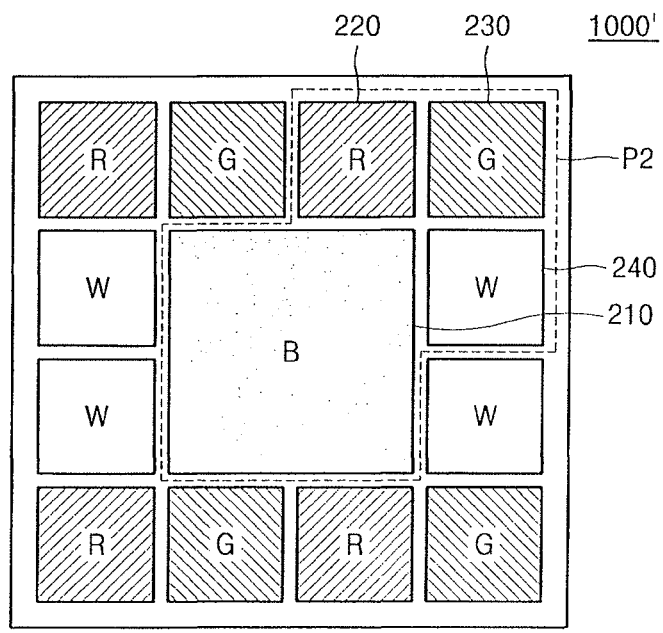

FIG. 6 is a magnified plan view of another embodiment of a unit structure 1000'. FIGS. 7A and 7B are diagrams schematically showing a method of driving the unit structure 1000' pixel-by-pixel. FIG. 8 is a diagram showing an example arrangement structure of the unit structures 1000'.

Referring to FIG. 6, the unit structure 1000' according to another embodiment may further include a third sub-unit S3 and a fourth sub-unit S4, as compared to the unit structure 1000 described previously with reference to FIGS. 1-5. A blue sub-pixel 210 may be disposed in the display area DA of a substrate, with the blue sub-pixel 210 being disposed at a center of the first sub-unit S1, the second sub-unit S2, the third sub-unit S3, and the fourth sub-unit S4 as described below.

In detail, the first sub-unit S1 may be located on the first side of the imaginary line L extending across the blue sub-pixel 210, whereas the second sub-unit S2 may be located on the second side of the imaginary line L extending across the blue sub-pixel 210. The third sub-unit S3 may be disposed on the first side of the imaginary line L, i.e., on a same side as the first sub-unit S1, whereas the fourth sub-unit S4 may be disposed on the second side of the imaginary line L, i.e., on a same side as the second sub-unit S2.

At this time, the third sub-unit S3 may be disposed not to overlap the first sub-unit S1, whereas the fourth sub-unit S4 may be disposed not to overlap the second sub-unit S2. In other words, while the third sub-unit S3 is on a same side as the first sub-unit S1, as viewed in a plan view, they are adjacent to each other along the imaginary line L, rather than being on top of each other. Similarly, while the fourth sub-unit S4 is on a same side as the second sub-unit S2, they are adjacent to each other along the imaginary line L, rather than being on top of each other. That is, the sub-units S1, S2, S3, and S4 may be arranged along a circumferential direction around the blue sub-pixel 210 so as to surround the blue sub-pixel 210.

Each of the sub-units S1, S2, S3, and S4 may include a red sub-pixel 220, a green sub-pixel 230, and a white sub-pixel 240. The first sub-unit S1, the second sub-unit S2, the third sub-unit S3, and the fourth sub-unit S4 of the blue sub-pixel 210 may constitute one unit structure 1000. The red sub-pixels 220, the green sub-pixels 230, and the white sub-pixels 240 of the sub-units S1, S2, S3 and S4 may be disposed at different locations from one another to surround a single blue sub-pixel.

Since each of the first sub-unit S1, the second sub-unit S2, the third sub-unit S3, and the fourth sub-unit S4 includes one red sub-pixel 220, one green sub-pixel 230, and one white sub-pixel 240, one unit structure 1000' includes four red sub-pixels 220, four green sub-pixels 230, four white sub-pixels 240, and one blue sub-pixel 210. Therefore, according to the present embodiment, the number of the blue sub-pixels 210, the number of the red sub-pixels 220, the number of the green sub-pixels 230, and the number of the white sub-pixels 240 in the one unit structure 1000' are in a ratio of 1:4:4:4.

Referring to FIGS. 7A and 7B, the unit structure 1000' may include the first pixel P1, the second pixel P2, a third pixel P3, and a fourth pixel P4. For convenience of explanation, descriptions will be given below based on the above-described method of driving the first pixel P1 and the second pixel P2.

The first sub-unit S1 and the blue sub-pixel 210 constitute the first pixel P1, whereas the second sub-unit S2 and the blue sub-pixel 210 constitute the second pixel P2. In other words, the first pixel P1 and the second pixel P2 may share the blue sub-pixel 210. In the same regard, the third pixel P3 and the fourth pixel P4 may share the blue sub-pixel 210.

Meanwhile, the blue sub-pixel 210 may be larger than the sub-pixels of other colors. According to an embodiment, when the sizes of the red sub-pixel 220, the green sub-pixel 230, and the white sub-pixel 240 are the same, the blue sub-pixel 210 may be four times larger than the other sub-pixels. As described above, the number of blue sub-pixels 210 included in the one unit structure 1000' may be smaller than those of the sub-pixels of the other colors. However, the display apparatus 10 includes one blue sub-pixel 210, so that the display apparatus 10 may even utilize the light-screening areas arranged between the sub-pixels to define the respective sub-pixels as emission areas In other words, the display apparatus 10 may have an increased aperture ratio.

Figure 8A:
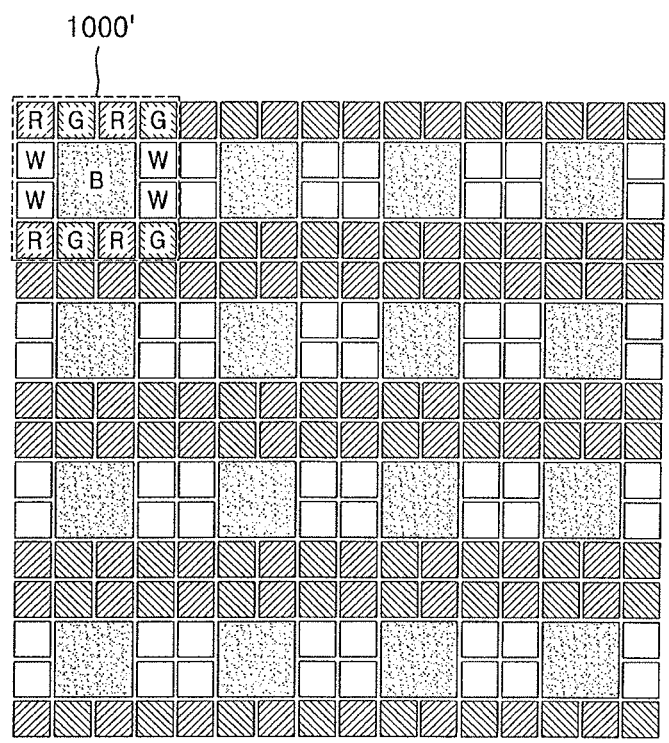
FIGS. 8(a) and 8(b) illustrate diagrams of example arrangements of the unit structures shown in FIG. 6 according to an embodiment.
Figure 8B:
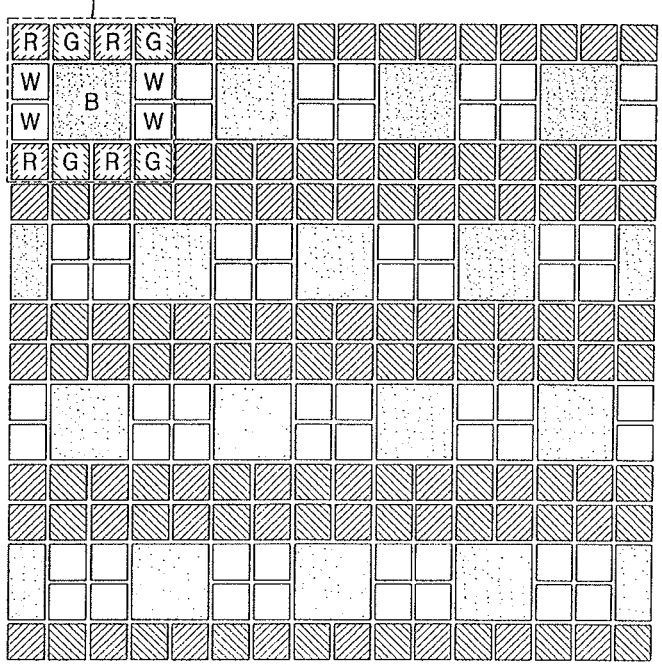

Referring to FIGS. 8(a) and 8(b), the plurality of unit structures 1000' may be arranged in a matrix-like shape or in a zigzag shape in a column-wise direction, respectively. In FIG. 8(b), the plurality of unit structures 1000' are shown in a zigzag pattern, where the blue sub-pixels 210 are arranged in a zigzag pattern not to overlap each other in a plan view. However, embodiments are not limited thereto, and the unit structures 1000' may include various types of arrangement structures.

Figure 9:
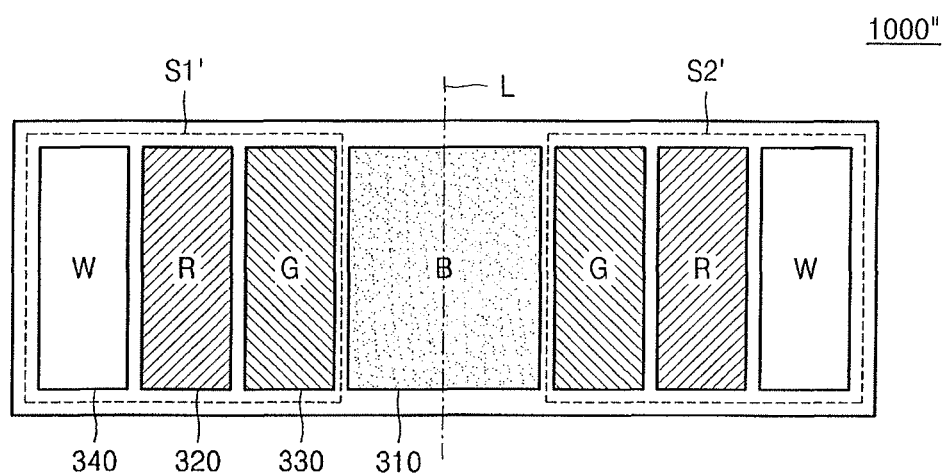
FIG. 9 illustrates a magnified plan view of another embodiment of the display apparatus of FIG. 1.
Figure 10:
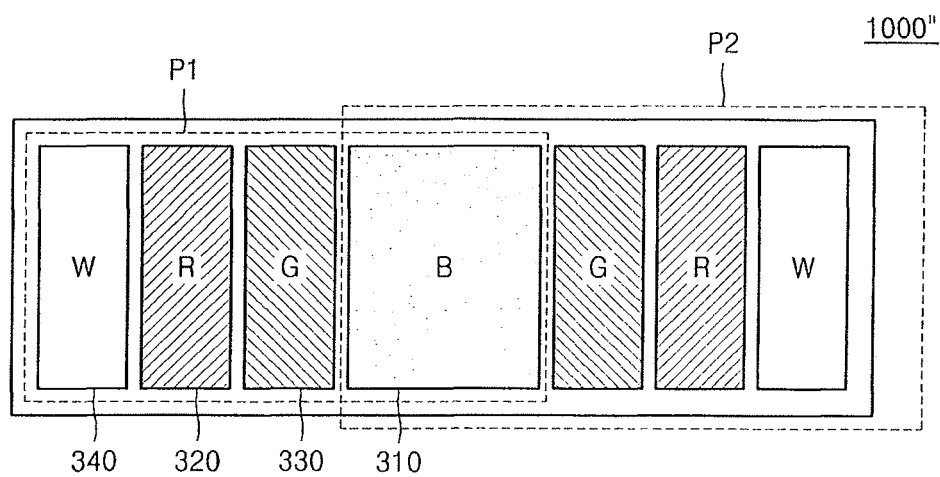
FIG. 10 illustrates a schematic diagram showing a method of driving the unit structure shown in FIG. 9 pixel-by-pixel according to an embodiment.
Figure 11:
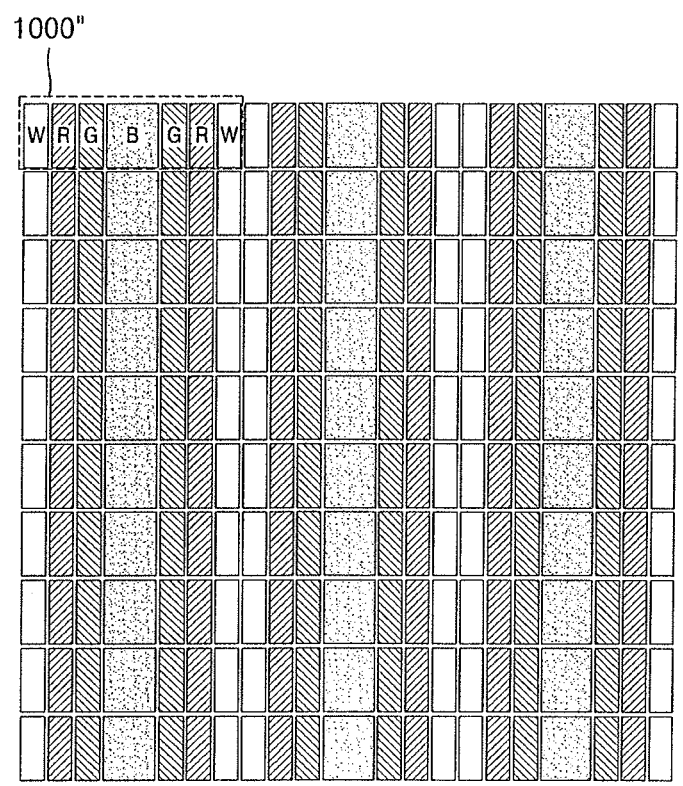
FIG. 11 illustrates a diagram showing an example arrangement structure of the unit structures shown in FIG. 9 according to an embodiment.

FIG. 9 is magnified plan view of another embodiment of a display apparatus according to embodiments. FIG. 10 is a schematic diagram showing a method of driving a unit structure 1000" shown in FIG. 9 pixel-by-pixel. FIG. 11 is a diagram showing an example arrangement structure of the unit structures 1000" shown in FIG. 9.

Referring to FIG. 9, a display apparatus according to embodiments may include a plurality of unit structure 1000", with each unit structure 1000" including a blue sub-pixel 310, a first sub-unit S1', and a second sub-unit S2'.

The blue sub-pixel 310 may be disposed in the display area DA of a substrate. The blue sub-pixel 310 may be disposed between the first sub-unit S1' and the second sub-unit S2' that are described below.

The first sub-unit S1' is located on the first side of an imaginary line L extending across the blue sub-pixel 310 and the second sub-unit S2' is located on the second side of the imaginary line L extending across the blue sub-pixel 310. Unlike the previous embodiments, a red sub-pixels 320, a green sub-pixels 330, and a white sub-pixels 330 of each of the first sub-unit S1' and the second sub-unit S2' according to the present embodiment may be arranged along a line intersecting the imaginary line L. In other words, each sub-pixel may be linearly arranged in a stripe-like shape, so a shape of each of the first sub-unit S1' and the second sub-unit S2' may be linear.

Referring to FIG. 10, the unit structure 1000" may include the first pixel P1 and the second pixel P2.

The first sub-unit S1' and the blue sub-pixel 310 constitute the first pixel P1, whereas the second sub-unit S2' and the blue sub-pixel 310 constitute the second pixel P2. In other words, the first pixel P1 and the second pixel P2 may share the blue sub-pixel 310. In the display apparatus according to the present embodiment, the sub-pixels are arranged in a row, unlike the previous embodiments, and thus the blue sub-pixel 310 may be shared in the direction in which the sub-pixels are arranged. Therefore, the display apparatus according to the present embodiment may minimize image roughening due to the shared blue sub-pixel 310.

Referring to FIG. 11, the plurality of unit structures 1000" according to the present embodiment may be arranged in a stripe-like shape. However, this is merely an example, and when seen from a top view, the plurality of unit structures 1000" may be regarded as being arranged in a matrix-like shape or a zigzag shape.

Table 1 shows simulation data regarding an aperture ratio of a blue sub-pixel according to a comparative embodiment and aperture ratios of blue sub-pixels of display devices according to the embodiments. In Table 1, simulation data was obtained based on a 55-inch UHD resolution in which aperture ratios of sub-pixels of different colors are the same. The Comparative Embodiment shows a case where sub-pixels are arranged in a stripe-like shape without sharing the blue sub-pixel. Embodiment 1 shows a case where a pixel group includes four pixels (as in FIG. 6), and Embodiment 2 shows a case where a pixel group includes two pixels (as in FIG. 2).

TABLE 1

| Comparative Embodiment | Embodiment 1 | Embodiment 2 |
| --- | --- | --- |
| 6.1% | 11.1% | 9.4% |

Referring to Table 1, the aperture ratios in Embodiment 1 and Embodiment 2 are improved, as compared to the aperture ratio of the first sub-pixel of the Comparative Embodiment. As compared with the Comparative Embodiment, the aperture ratio of the blue sub-pixel is increased by about 1.82 times in Embodiment 1, and the aperture ratio of the blue sub-pixel is increased by about 1.54 times in Embodiment 2.

As described above, the display apparatus according to embodiments may improve the aperture ratio of blue sub-pixels by disposing one blue sub-pixel for pixels adjacent to one another and applying one average signal to the blue sub-pixel. Due to the increased aperture ratio, the overall brightness of the display apparatus may be improved and power consumption of the display apparatus may be reduced. Furthermore, in case of an organic light-emitting display apparatus, the life span of an organic emission layer may be increased due to reduction of power consumption.

Figure 12:
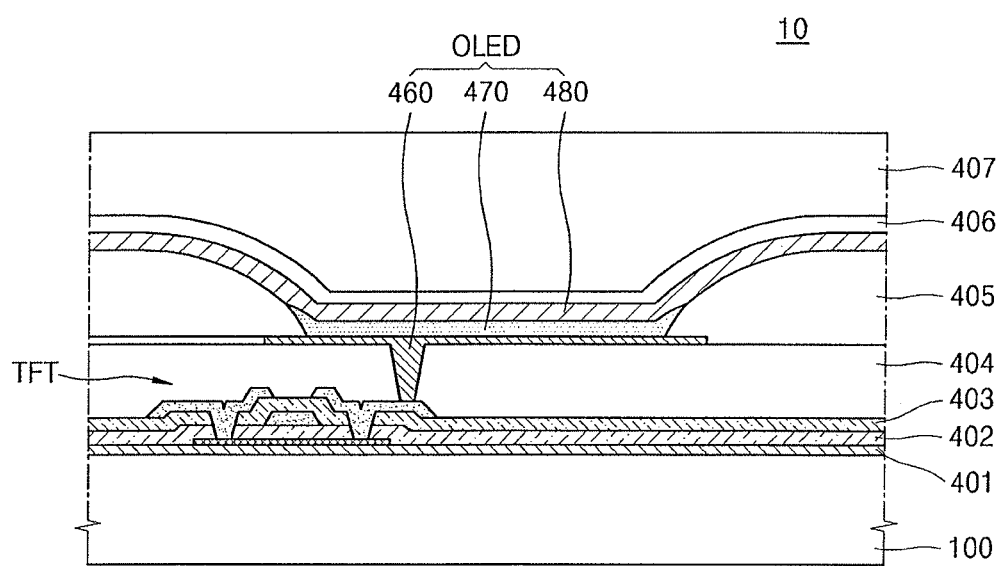
FIG. 12 illustrates a schematic cross-sectional view of a display apparatus according to an embodiment.

FIG. 12 is a schematic cross-sectional view of a display apparatus 10 according to embodiments.

Referring to FIG. 12, the display apparatus 10 may include the substrate 100 and a plurality of display devices that constitute the plurality of pixels on the substrate 100. The plurality of pixels on the substrate 100 have the above-stated characteristics according to embodiments.

The display device may be a liquid crystal display device, an organic light-emitting display device, a plasma display device, or an electrophoretic display device. Furthermore, the display device may include a thin-film transistor. FIG. 12 shows an example in which an organic light-emitting diode (OLED) display device is applied. However, embodiments are not limited thereto.

The substrate 100 may be rigid or flexible. For example, the substrate 100 may include a glass material, a metal, or a plastic material, e.g., polyethylene terephthalate (PET), polyethylene naphthalate (PEN), and polyimide.

The display apparatus 10 may further include a buffer layer 401 on the substrate 100 for preventing impurities from penetrating into a semiconductor layer of a thin-film transistor TFT, a gate insulating film 402 for insulating the semiconductor layer of the thin-film transistor TFT from a gate electrode, an interlayer insulating film 403 for insulating a source electrode and a drain electrode of the thin-film transistor TFT from the gate electrode, and a planarizing film 404 that covers the thin-film transistor TFT and includes a substantially flat top surface.

The display apparatus 10 may further include an organic light-emitting diode OLED that includes an electrode layer 460, an intermediate layer 470 disposed on the electrode layer 460, and a counter electrode 480 disposed on the intermediate layer 470. According to the present embodiment, the electrode layer 460 may be an anode and the counter electrode 480 may be a cathode. However, embodiments are not limited thereto, and the electrode layer 460 may be a cathode and the counter electrode 480 may be an anode according to methods of driving an organic light-emitting display device. Holes and electrons are injected into an emission layer provided in the intermediate layer 470 from the electrode layer 460 and the counter electrode 480, respectively. As excitons, generated as the holes and the electrons are combined, are transitioned from an excited state to a ground state, light is emitted from the intermediate layer 470.

The electrode layer 460 may be electrically connected to any one of the source electrode and the drain electrode of the thin-film transistor TFT. The electrode layer 460 may include a metal oxide having light-transmitting property. Alternatively, the electrode layer 460 may have a triple layer structure including a transparent conductive oxide layer/a semitransparent metal layer/a transparent conductive oxide layer. According to embodiments, types of materials constituting the electrode layer 460 are not limited. According to another embodiment, the electrode layer 460 may be disposed as a reflective electrode.

The pixel defining film 405 exposes the upper surface of the electrode layer 460 via an opening, and the intermediate layer 470 including the emission layer may be located on the exposed upper surface of the electrode layer 460. The pixel defining film 405 defines a pixel region and a non-pixel region. In other words, the opening of the pixel defining film 405 becomes a substantial pixel region.

In addition to the organic emission layer, the intermediate layer 470 may include a hole transport layer (HTL), a hole injection layer (HIL), an electron transport layer (ETL), and an electron injection layer (EIL). The counter electrode 480 may be disposed on the intermediate layer 470. The electrode layer 460 may be patterned pixel-by-pixel, and the counter electrode 480 may be disposed to apply a common voltage to all of the pixels.

Although only one organic light-emitting diode OLED is shown in FIG. 12, the display apparatus 10 may include a plurality of organic light-emitting diodes OLED. One pixel may be disposed for each of the organic light-emitting diodes OLED, and red, green, blue, or white color may be implemented by each pixel.

However, embodiments are not limited thereto. The intermediate layer 470 may be disposed in common with respect to the entire planarizing film 404 regardless of locations of the pixels. Here, the organic emission layer may be disposed by vertically stacking or mixing layers including, for example, light-emitting materials emitting red, green, and blue light. White light may be emitted, different color combinations may be implemented. Furthermore, a color conversion layer or a color filter for converting emitted white light into light of a certain color may be further provided.

A protection layer 406 may be disposed on the organic light-emitting diode OLED and the pixel defining film 405, and may cover and protect the organic light-emitting diode OLED. The protection layer 406 may include an inorganic insulating film and/or an organic insulating film. An encapsulation film 407 may include an inorganic film and an organic film, and may have a structure in which the inorganic film and the organic film are alternately stacked.

By way of summation and review, a display device may have pixels arranged in a stripe-like shape or a matrix-like shape. However, the number of barrier layers disposed between the pixels increases as the resolution increases, and thus, the aperture ratio of the pixels decreases.

Further, a display device may also have pixels arranged in a pentile-matrix structure, so the numbers of red pixels and blue pixels are reduced to half of those of the stripe-like shape, and the total number of pixels is reduced to ⅔ of that of the stripe-like shape. As a result, a high aperture ratio and a same visual resolution as that of the stripe-like shape may be realized. However, it may be difficult to implement a pentile-matrix structure with a high resolution equal to or higher than 440 pixels per inch (ppi), and also, as the number of pixels decreases, there may be a problem in image quality when an actual image is implemented.

Therefore, according to one or more embodiments, a display apparatus exhibits high resolution without an image quality problem, as well as improved life span and production yield based on high aperture ratios. That is, the display apparatus according to embodiments may include a single first sub-pixel shared by multiple pixels in a pixel group, and applying one average signal to the single first sub-pixel, thereby increasing an aperture ratio of the first sub-pixel. Due to the increased aperture ratio, overall brightness of the display apparatus may be improved, and power consumption of the display apparatus may be reduced. Furthermore, in case of an OLED display apparatus, the life span of an organic emission layer may be increased due to the reduction of power consumption.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a substrate;
    a first pixel and a second pixel disposed adjacent to each other on the substrate; and
    a blue sub-pixel shared by the first pixel and the second pixel,
    wherein
    the first pixel further includes a first red sub-pixel, a first green sub-pixel, and a first white sub-pixel,
    the second pixel further includes a second red sub-pixel, a second green sub-pixel, and a second white sub-pixel,
    the first red sub-pixel, the first green sub-pixel, the second red sub-pixel, and the second green sub-pixel are disposed along a first row, and
    the first white sub-pixel, the blue sub-pixel, and the second white sub-pixel are disposed along a second row adjacent to the first row.

2. The display apparatus as claimed in claim 1, wherein the blue sub-pixel overlaps the first green sub-pixel and the second red sub-pixel along a column direction.

3. The display apparatus as claimed in claim 1, wherein an area of the blue sub-pixel is greater than an area of each of the first red sub-pixel, the first green sub-pixel, and the first white sub-pixel.

4. The display apparatus as claimed in claim 1, wherein the blue sub-pixel emits light according to a data signal generated based on blue-related data of first pixel data corresponding to the first pixel and blue-related data of second pixel data corresponding to the second pixel.

5. The display apparatus as claimed in claim 1, further comprising:
    a third pixel and a fourth pixel sharing the blue sub-pixel;
    wherein
    the third pixel further includes a third red sub-pixel, a third green sub-pixel, and a third white sub-pixel,
    the fourth pixel further includes a fourth red sub-pixel, a fourth green sub-pixel, and a fourth white sub-pixel,
    the third white sub-pixel, the blue sub-pixel, and the fourth white sub-pixel are disposed along a third row adjacent to the second row,
    the third red sub-pixel, third green sub-pixel, fourth red sub-pixel, and fourth green sub-pixel are disposed along a fourth row adjacent to the third row, and
    the blue sub-pixel is disposed in both the second row and the third row.

6. The display apparatus as claimed in claim 5, wherein the blue sub-pixel emits light according to a data signal generated based on blue-related data of first pixel data corresponding to the first pixel, blue-related data of second pixel data corresponding to the second pixel, and blue-related data of third pixel data corresponding to the third pixel and blue-related data of fourth pixel data corresponding to the fourth pixel.

7. The display apparatus as claimed in claim 5, wherein the first pixel, the second pixel, the third pixel, and the fourth pixel constitute a single unit structure, the display apparatus further including a plurality of the unit structures arranged in a matrix-like shape.

8. The display apparatus as claimed in claim 1, wherein the first pixel and the second pixel constitute a single unit structure, the display apparatus further including a plurality of the unit structures arranged in a matrix-like shape.

9. The display apparatus as claimed in claim 1, wherein the first pixel and the second pixel constitute a single unit structure, the display apparatus further including a plurality of the unit structures arranged in a zigzag shape.

10. The display apparatus as claimed in claim 1, wherein the display apparatus is an organic light-emitting diode display apparatus.

11. A display apparatus, comprising:
    a substrate;
    a first pixel and a second pixel disposed adjacent to each other on the substrate; and
    a blue sub-pixel shared by the first pixel and the second pixel,
    wherein
    the first pixel further includes a first red sub-pixel, a first green sub-pixel, and a first white sub-pixel,
    the second pixel further includes a second red sub-pixel, a second green sub-pixel, and a second white sub-pixel,
    the first white sub-pixel, the first red sub-pixel, the first green sub-pixel, the blue sub-pixel, the second green sub-pixel, and the second red sub-pixel, and the second white sub-pixel are disposed sequentially along a first row, and an area of the blue sub-pixel is larger than an area of each of the first white sub-pixel, the first red sub-pixel, and the first green sub-pixel.

12. The display apparatus as claimed in claim 11, wherein the first pixel and the second pixel constitute a single unit structure, the display apparatus further including a plurality of the unit structures arranged in a matrix-like shape.

13. The display apparatus as claimed in claim 11, wherein the first pixel and the second pixel constitute a single unit structure, the display apparatus further including a plurality of the unit structures arranged in a zigzag shape.

14. The display apparatus as claimed in claim 11, wherein the display apparatus is an organic light-emitting diode display apparatus.

* * * * *